United States Patent

Kodama

[11] Patent Number: 5,694,043
[45] Date of Patent: Dec. 2, 1997

[54] CONNECTOR CHECKING DEVICE

[75] Inventor: Shinji Kodama, Shizuoka, Japan

[73] Assignee: Yazaki Corporation, Tokyo, Japan

[21] Appl. No.: 688,764

[22] Filed: Jul. 31, 1996

[30] Foreign Application Priority Data

Aug. 2, 1995 [JP] Japan ............... 7-197690

[51] Int. Cl.$^6$ .................................. G01R 27/26
[52] U.S. Cl. ........................... 324/538; 439/489
[58] Field of Search .............. 324/538; 439/310, 439/488, 489, 490

[56] References Cited

U.S. PATENT DOCUMENTS

| | | | |
|---|---|---|---|
| 4,849,743 | 7/1989 | Ohno | 439/490 |
| 5,335,413 | 8/1994 | Yamamoto | 324/538 |
| 5,498,966 | 3/1996 | Yamamoto | 324/538 |
| 5,604,440 | 2/1997 | Tomikawa | 324/538 |
| 5,629,627 | 5/1997 | Hoshino | 324/538 |

FOREIGN PATENT DOCUMENTS 62-47093  12/1987  Japan .

*Primary Examiner*—Vinh P. Nguyen
*Assistant Examiner*—Jose M. Solis
*Attorney, Agent, or Firm*—Armstrong, Westerman, Hattori, McLeland & Naughton

[57] ABSTRACT

The connector checking device of the present invention comprises: a connector holding member 6, and a checking device main body 3 detachably mounted from the connector holding member, wherein the main body is further provided with a plurality of check pins 11 connected with an electric circuit and urged toward the connector holding member by a coil spring 12, and a spacer removing piece 14 formed with a hook 14c which is also urged toward the connector holding member by another coil spring 15. During the checking operation, the check pin is brought into contact with a terminal C which is fully inserted into the terminal accommodating chamber of a connector to be checked, and the electric circuit is energized, and when the main body 3 is separated from the connector holding member 6 on completion of the checking operation, the hook 14c of the spacer removing piece 14 is engaged with a spacer 27 which is within a deformation absorbing space formed in the connector housing of the connector, so that the spacer is automatically removed in accordance with the separating movement of the main body 2.

2 Claims, 6 Drawing Sheets

5,694,043

1

CONNECTOR CHECKING DEVICE

BACKGROUND OF THE INVENTION

1. Field of the Invention

The present invention relates to a checking device for checking connectors used for interconnecting wiring harnesses or the like distributed in automotive vehicles, and more particularly to an improved connector checking device which is capable of detecting whether a connector terminal is set in a proper position within each connector housing, whether the electric wire connected to the terminal is in an electrically conductive state, and also capable of, on completion of the checking operation, automatically removing a spacer which has been inserted into an empty space provided for permitting a deformation of a resilient locking piece formed in the connector housing to retain the inserted terminal.

2. Description of the Prior Art

In FIG. 9, reference numeral 30 denotes a connector housing, and numeral 36 denotes a checking device. In the housing 30 there are formed a plurality of terminal accommodating chambers 31, in each of which a cantilever resilient locking piece 32 is provided, whereby a connector terminal 33 inserted from the rear side of the terminal accommodating chamber is retained by the resilient locking piece 32.

During the inserting movement of the connector terminal 33, when the front end portion thereof abuts against a locking projection 32a of the resilient locking piece 32, the locking piece 32 is once deformed into a deformation absorbing space 34, and thereafter when a fitting groove 33a of the terminal 33 is fitted with the locking projection 32a, that is, when the terminal 33 is fully inserted and set in a predetermined proper position, the resilient locking piece 32 is returned to the original position thereof to firmly retain the terminal 33.

After the terminal 33 is inserted into the chamber, normally a spacer 35 is inserted into the deformation absorbing space 34 from the front side of the terminal accommodating chamber 31. In this occasion however, if the terminal 33 is not set in a fully inserted position, the deformation absorbing space 34 is blocked by the resilient locking piece to prevent the spacer 35 from being inserted thereto, whereby it is detected that the terminal 33 is not properly inserted.

On the other hand, the checking device 36 is provided with a cylindrical checking terminal 37 corresponding to each terminal accommodating chamber 31 of the housing 30, and an electrically conductive lead pin 38 is provided in a slidable manner toward the checking terminal 37, and is normally protruded toward the terminal 33 by the urging force of a coil spring 39.

When the connector housing 30 of a connector to be checked is set in the checking room 36a of the checking device 36, the lead pin 38 abuts against the front end of the connector terminal 33 which is in a fully inserted and locked state, and is shifted toward the checking terminal 37 against the rearwardly urging force of the coil spring 39 to be finally brought into contact with the checking terminal 37, so that the checking circuit 40 is energized and a check lamp 41 is lit, giving thus a judgment that the terminal 33 is in a fully inserted state.

However, in the event that the terminal 33 is, as shown in FIG. 10, inserted only to the half way within the terminal accommodating chamber, and the resilient locking piece 32 is not deformed into the deformation absorbing space 34,

2 although the spacer 35 can be inserted therein, the terminal 33 is backwardly protruded from the rear end of the terminal accommodating chamber 31 and the circuit 40 is not energized, so that it can be judged that the terminal 33 is not properly inserted.

As explained above, although the spacer 35 is useful for judging whether or not the terminal 33 is properly inserted during the assembling operation of the connector housing 30, it becomes useless once the electrical connection check between the terminal 33 and the lead wire 42 by use of the checking device is completed. However, the removing operation of the spacer 35 one by one in a separate process after the electrical connection check requires an additional process, to thereby increase the total cost thereof, which offsets the advantage of reducing the total weight and number of required members obtained by the removal of spacer 35.

The present invention is made for solving the above problem, and it is an object of the present invention to provide a connector checking device for checking a connector provided with a spacer, which is capable of automatically removing the spacer, as well as checking an electrical connection thereof.

SUMMARY OF THE INVENTION

In order to accomplish the above object, the present invention provides a connector checking device for checking a connector, wherein a connector to be checked comprises a connector housing composed of a plurality of terminal accommodating chambers, each being provided with a resilient locking piece for firmly retaining the connector terminal fully inserted therein, and of a deformation absorbing space formed for permitting a deformation of the resilient locking piece, and inside the deformation absorbing space, inside which deformation absorbing space a spacer formed with a locking projection at its rear end is inserted for checking whether the terminal is fully inserted, wherein the connector checking device comprises a connector holding member, and a checking device main body which is detachably mounted from the connector holding member, characterized in that the main body is further provided with a plurality of check pins connected with an electric circuit and urged toward the connector holding member by a spring, and a spacer removing piece formed with a hook also urged toward the connector holding member by another spring, and that when the check pin is brought into contact with the fully inserted terminal, the electric circuit is energized, and the hook of the spacer removing piece is fitted with the spacer inserted in the deformation absorbing space, and thereafter when the main body is separated from the connector holding member, the spacer removing piece is completely drawn out from the terminal accommodating chamber.

In accordance with the present invention as described in claim 1, since it is constructed such that the connector holding member and the checking device main body are detachably mounted, and the main body is provided with a plurality of check pins connected with an electric circuit and urged forward by a spring, and characterized in that when each of the check pins is brought into contact with a fully inserted terminal to energize the electric circuit, it can be judged whether the connector terminal is properly inserted and firmly locked, as well as whether the connector is in an electrically conductive state including the lead wire connected thereto.

Further, since in the main body the spacer removing piece formed with a hook is urged forward by a spring, and in the occasion that the main body is separated from the connector holding member on completion of the checking operation, the hook of the spacer removing piece is engaged with the spacer inserted in the deform absorbing space of the terminal accommodating chamber, and the spacer is thus removed from the terminal accommodating chamber, it can be automatically removed during the connector checking operation.

Other features and advantages of the invention will be apparent from the following description taken in connection with the accompanying drawing.

DETAILED DESCRIPTION OF THE PREFERRED EMBODIMENTS

Figure 1:
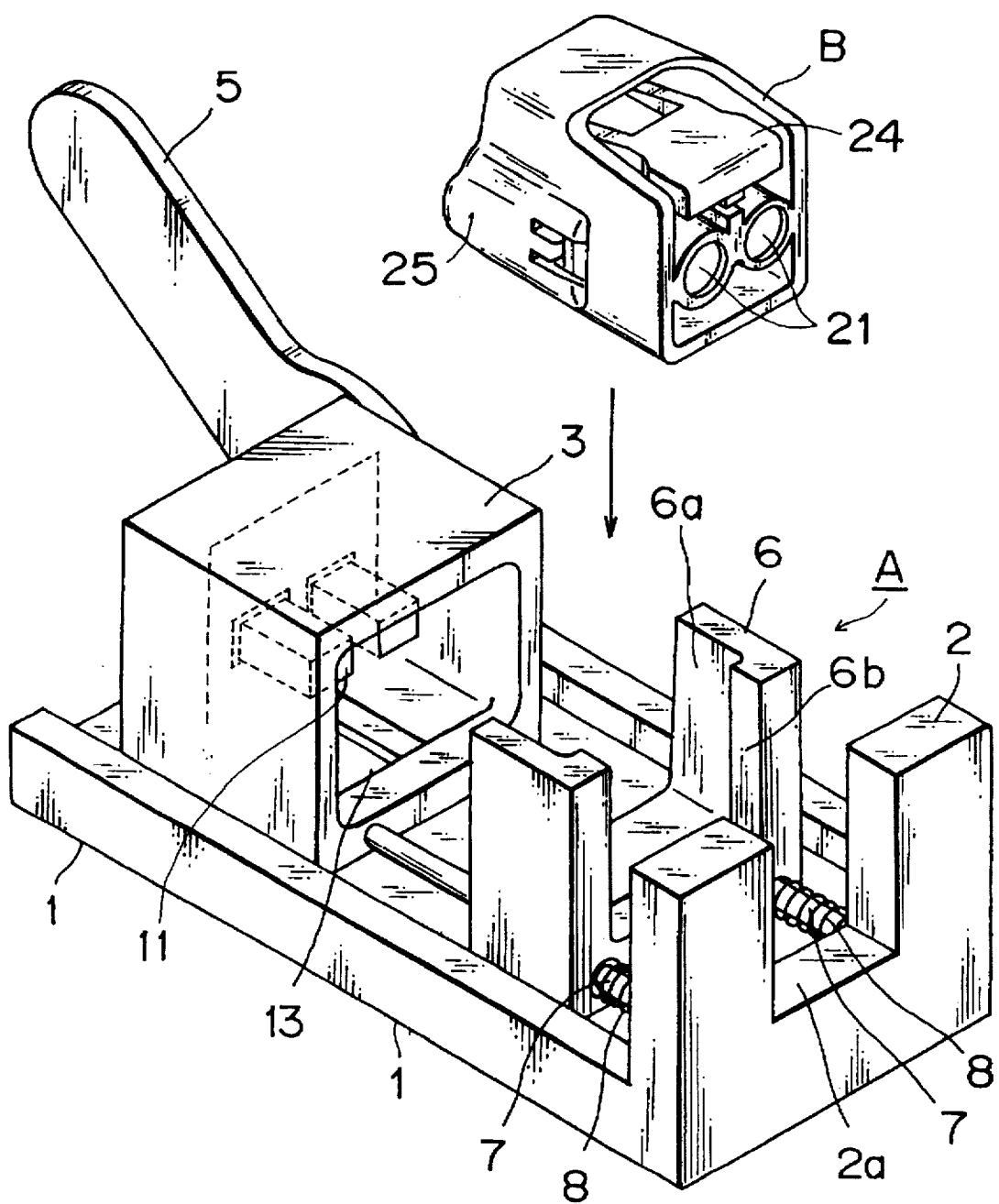
FIG. 1 is a perspective view of a connector checking device of the present invention.

In the following, one embodiment of the present invention is explained.

In FIGS. 1 to 5, reference character A denotes a connector checking device, and character B denotes a connector to be checked. The checking device A is provided with an upright fixed wall 2 having a lead wire drawing path open at one side of a base plate 1, while a main body 3 is mounted at the other side in a shiftable manner toward the fixing wall 2 and is moved reciprocally backward and forward in accordance with the movement of an operation lever 5 which is linked to the main body 3 and rotatably supported by a lateral shaft 4.

Between the fixing wall 2 and the main body 3, there is formed a connector holding member 6 which is provided with a connector setting room 6a whose upper side and one side facing toward the main body 3 are open, and a lead wire drawing path is also open at the fixing wall 2 side. The connector holding member 6 is urged toward the main body 3 by a coil spring 8 which is wound around a guide shaft 7 that protrudes from the fixing wall 2 and reaches to the connector holding 6, and is shifted by the main body 3 against the urging force of the coil spring 8.

Figure 3:
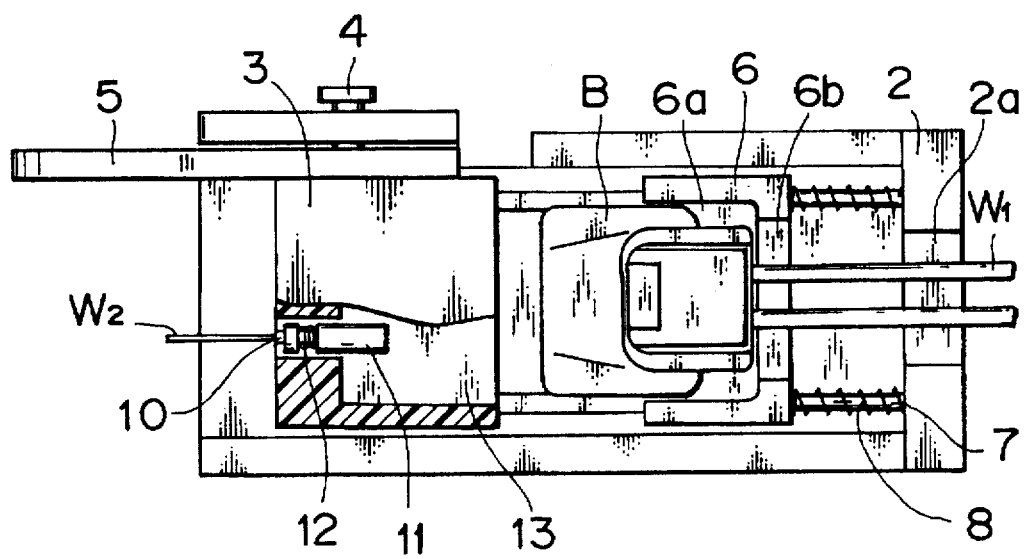
FIG. 3 is a partly broken plain view of the checking device of FIG. 1.
Figure 4:
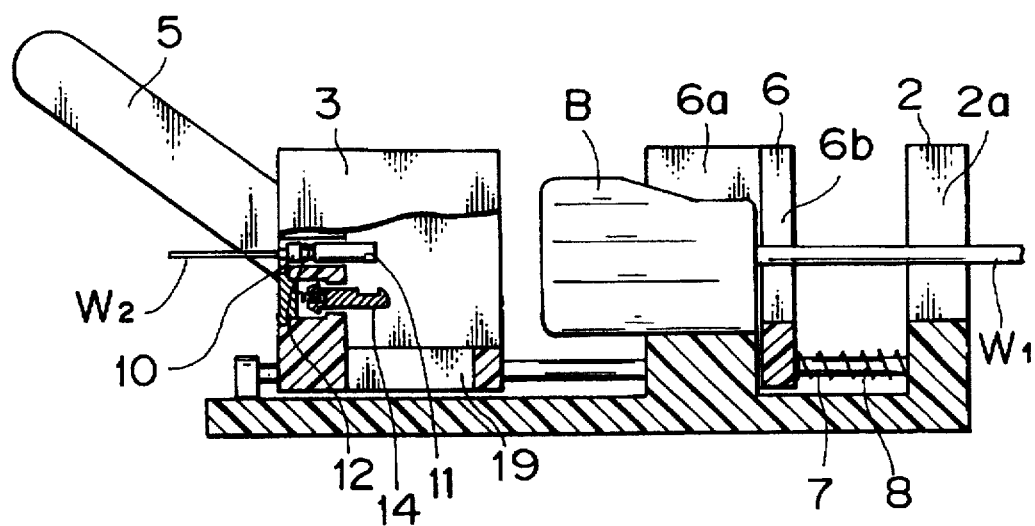
FIG. 4 is a partly broken side view of the checking device of FIG. 1.

The connector to be checked is inserted into the connector holding member 6 from the upper side thereof to be accommodated and set therein, during which operation a plurality of lead wires W1 drawn from the rear end of the connector B are guided in the lead wire drawing paths 6b and 2a. (FIGS. 3 and 4).

Figure 9:
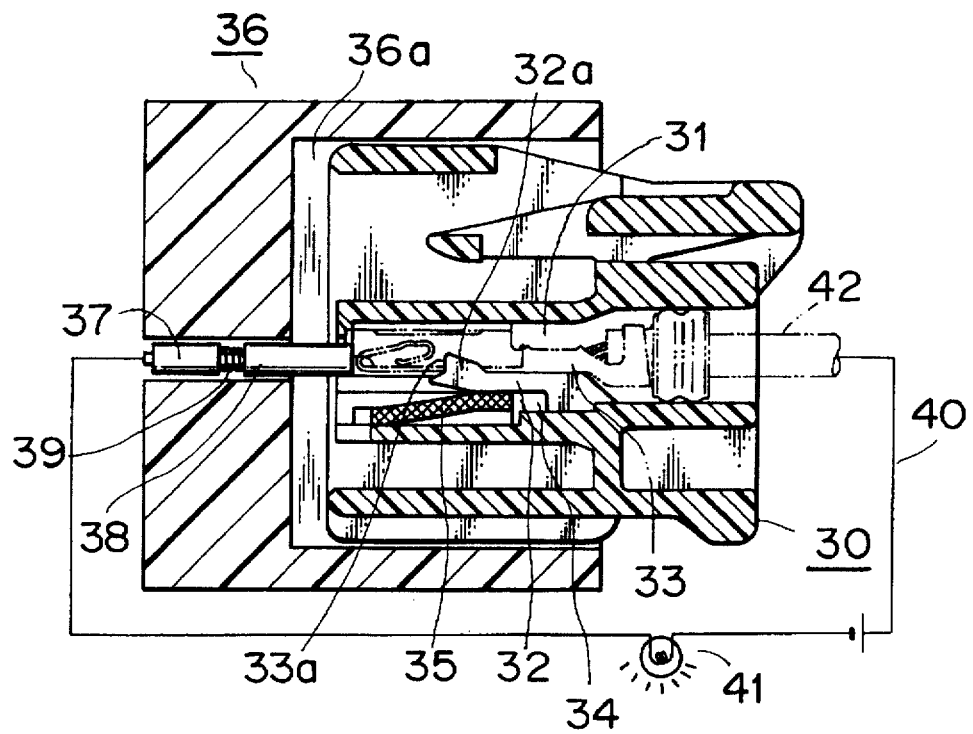
FIG. 9 is a sectional view of an important part showing a state in which a checking operation is conducted by a conventional checking device.
Figure 10:
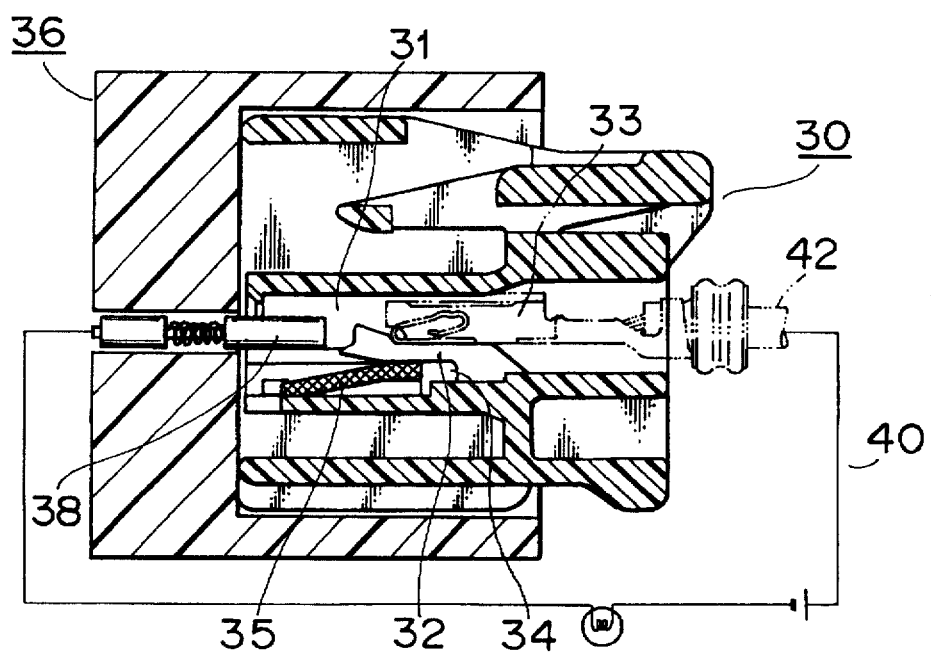
FIG. 10 is a sectional view showing another checking state by the conventional checking device of FIG. 9.

Provided in the main body 3 are a plurality of checking terminals 10, each of which is to be fitted into a corresponding one of a plurality of terminal accommodating chambers 21 within the housing 20 of the connector B. The checking terminal 10 is provided with a check pin 11 in a slidable manner, which is protruded into the checking room 13 by a coil spring 12. It is to be noted that the checking terminal 10 is connected with a checking circuit 40 having a check lamp 41 just as the conventionally used one shown in FIG. 9, although it is not shown by a figure in order to avoid a repetitive explanation.

Further, within the main body 3, a spacer removing piece 14 is provided in a protruded manner into the checking chamber 13 by a coil spring 15 so as to be fitted into the deformation absorbing space 23 of a resilient locking piece 22 formed in each of the terminal accommodating chambers 21. The main body 3 is also formed with a spacer disposing hole 19 in the bottom wall 13a thereof under the spacer removing piece 14.

Figure 5:
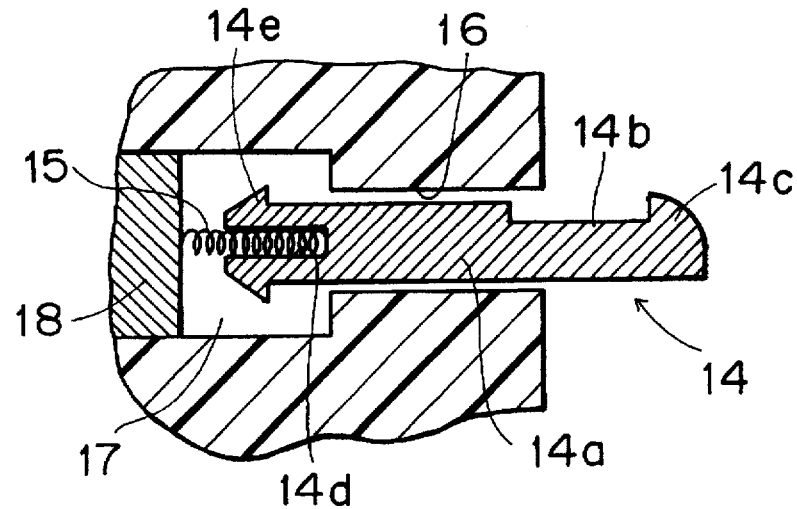
FIG. 5 is a magnified sectional view of an important part of FIG. 4.

As shown in the magnified sectional view of FIG. 5, the spacer removing piece 14 is composed of a main portion 14a having a square sectional surface, a hook 14c at the front end portion thereof by way of a recess 14b formed just behind the hook, a slit 14d formed at the rear end of the main portion 14a for receiving and fixing the coil spring 15 therein, and a pair of stoppers 14e respectively protruding upper and lower directions from the rear end of the main portion 14a. The main portion 14a is slidably mounted inside a guide hole 16 formed in the main body 3, and the coil spring 15 for urging forwardly the spacer removing piece 14 is mounted between a side wall 18 and the slit 14d inside a spring chamber 17 which is extended integrally from the guide hole 16, which spring chamber having a longer diameter than that of the guide hole 16.

Figure 2A:
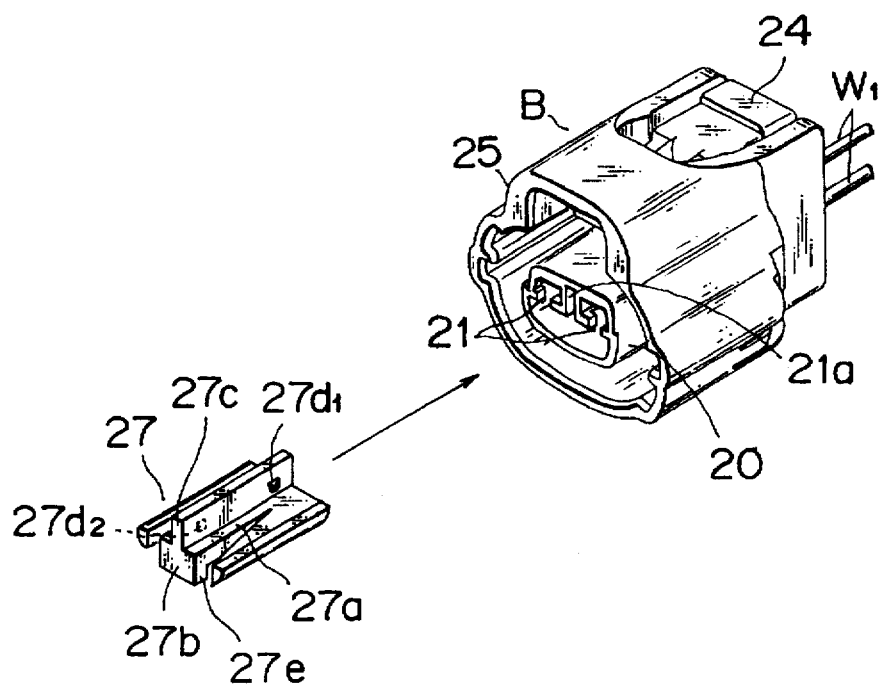
FIG. 2A is a perspective view of a connector B observed from the front side thereof.

As shown in FIGS. 1 and 2, a plurality of terminal accommodating chambers 21 are formed in the housing 20 of the connector B (—in the embodiment two chambers are aligned laterally), and within each of the chambers 21 the resilient locking piece 22 having a locking projection 22a is provided together with the deformation absorbing space 23. Further, around the external periphery of the housing 20, there are provided a locking arm 24 to be fitted with a corresponding opposing connector (not shown), together with a water-proof hood 25 for receiving the opposing connector, wherein an annular seal packing 28 is fixedly attached in the space between the hood 25 and the external periphery of the housing 21.

On the other hand, a spacer assembly 27 is inserted into the pair of laterally aligned terminal accommodating chambers 21 from the front side thereof. This spacer assembly is integrally formed by interconnecting a pair of spacers 27a, 27a at the opposite lateral sides by way of a central connection base 27b which is further provided with an insertion guide piece 27c at the upper portion thereof which is to be inserted into a guide groove 21a formed between the two terminal accommodating chambers 21 and on the lower surface thereof there is provided a downward projection 27e to be fitted with the hook 14c of the above spacer removing piece 14. The insertion guide piece 27c is further provided with a preliminary locking projection 27d1 at the front side portion of one surface thereof, while provided with a main locking projection 27d2 at the rear side portion of the other surface, so that these projections are fitted into a recess formed in the guide groove 21a (not shown) to be locked therewith.

Figure 7:
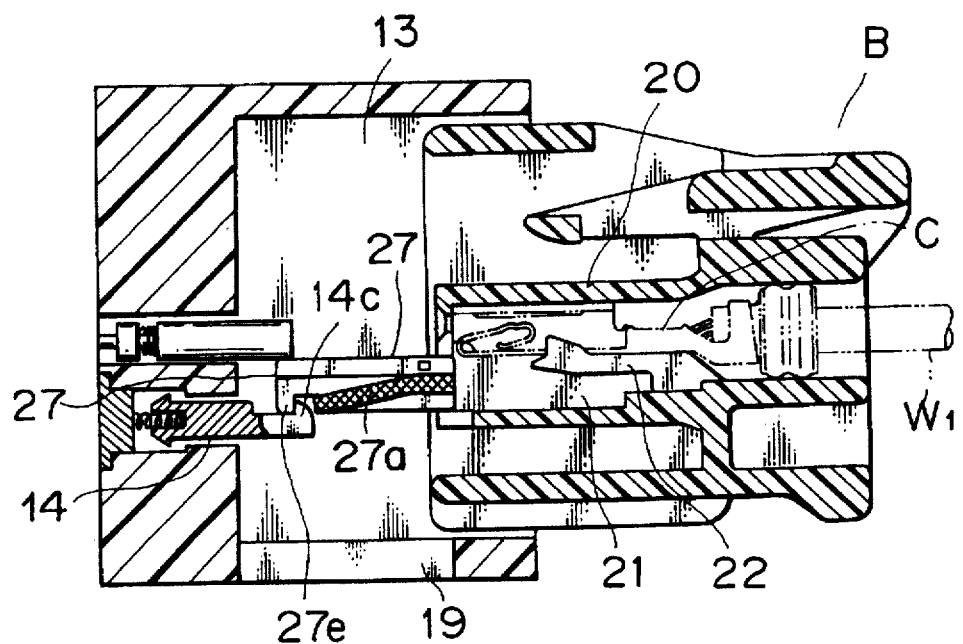
FIG. 7 is a sectional view of an important part showing a state that a spacer is being removed after the state of FIG. 6.
Figure 8:
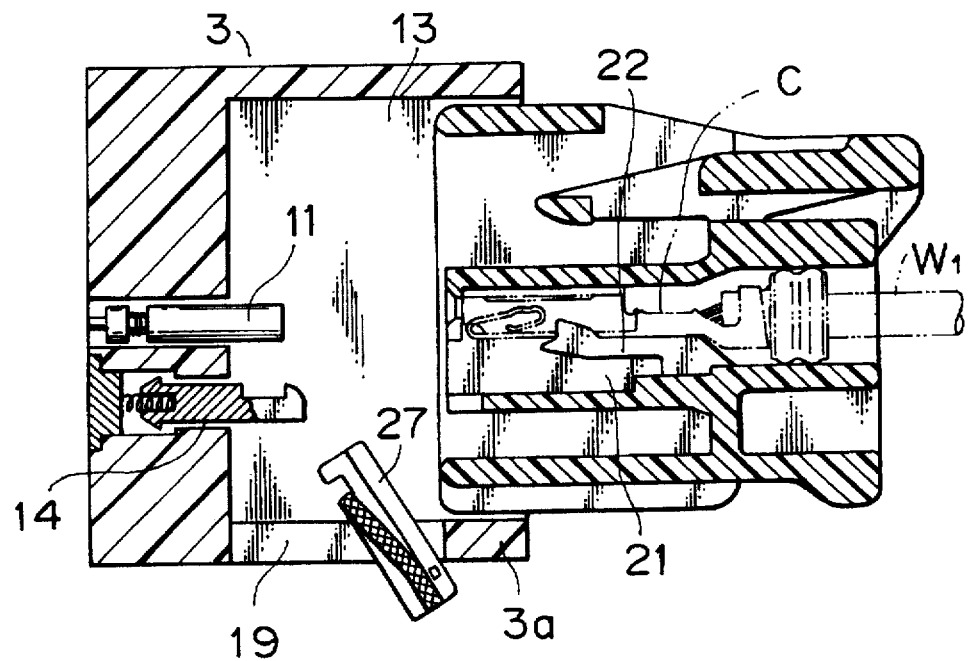
FIG. 8 is a sectional view of an important part showing a state that the spacer removing movement of FIG. 7 is completed.

Next, a method for checking a connector by the checking device A and for removing the spacer is now explained with reference to FIGS. 6 to 8.

For checking the connector, first set the connector B to the connector holding member 6, and then rotate the operation lever 5 to move forward the main body 3, so that the front portion of the connector B is received by the checking room 13, and simultaneously the check pin 11 is brought into contact with the electrical contact portion C1 of a female terminal C.

Figure 2B:
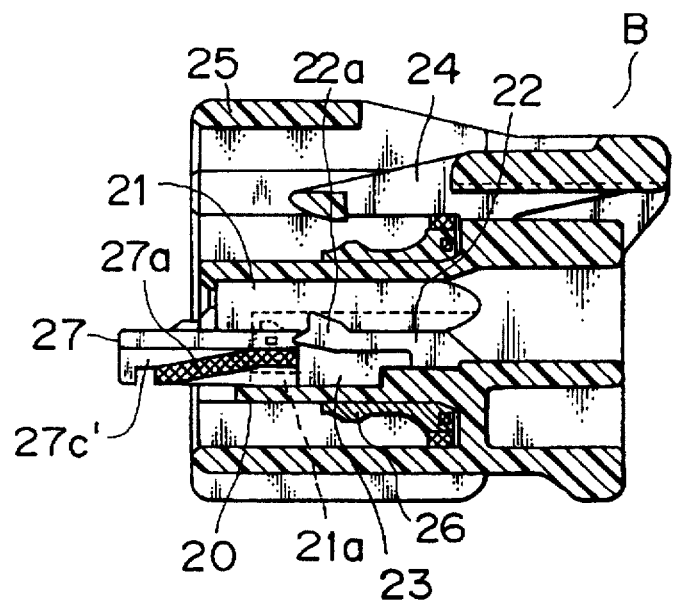
FIG. 2B is a magnified partly sectioned view of the connector B.
Figure 6:
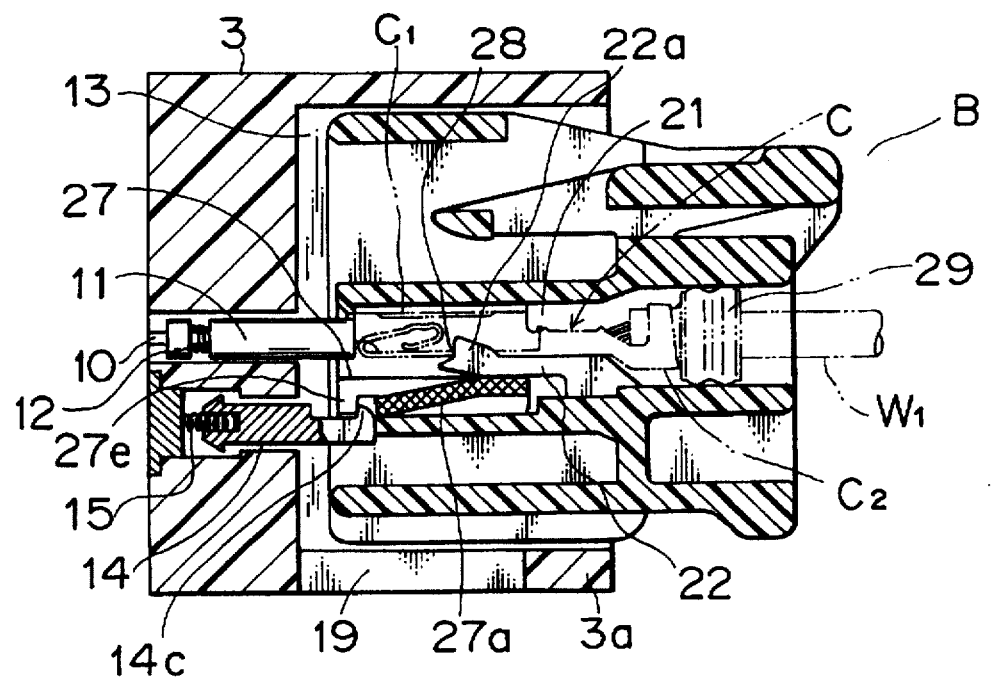
FIG. 6 is a sectional view of an important part in which a connector is being checked by the checking device of FIG. 1.

As shown in FIG. 6, when the terminal C in the terminal accommodating chamber 21 is fully inserted, the resilient cantilever locking piece 22 is returned to the original position thereof by fitting the locking projection 22a thereof into the fitting groove 28 of the terminal C, and the spacer 27a of the spacer assembly 27 is inserted into the emptied deformation absorbing space 23 (refer to FIG. 2B).

For checking the connector B at this stage, as the check pin 11 corresponding to the terminal C is pushed and brought into contact with the checking terminal 10 against the urging force of the coil spring 12, the before-mentioned checking circuit is electrically contacted. By this, the terminal C of the connector B is accommodated and locked at the proper position and its electrically conductive state with the lead wire W1 is also judged to be fine. By the way, it is to be noted that since the method for checking the connector B with its terminal C resided in an imperfectly inserted state is same as the conventional method, the explanation thereabout is eliminated here.

Simultaneously with the above checking operation of the connector B, the spacer removing piece 14 in the checking room 13 is urged in the forward direction by the coil spring 15, and the hook 14c thereof is fitted with the projection 27e of the spacer assembly 27. Accordingly, if the operation lever 5 is rotated in the opposite direction on completion of the above checking operation, or by the rebutting force of the coil spring 8 to separate the main body 3 from the connector holding member 6, the spacer assembly 27, that is, the spacer 27a is gradually drawn out from the terminal accommodating chamber 21 as shown in FIG. 7, and when it is completely separated from the chamber 21, it loses its support at one side thereof and falls down by its weight, and finally disposed from the spacer disposing hole 19 formed in the bottom surface 3a of the main body 3.

As explained above, on completion of the connector B checking operation by use of the checking device A, the main body 3 is separated from the connector holding member 6, so that the spacer 27a or spacer assembly 27 is automatically drawn out.

The above operation is explained in the case that a spacer assembly 27, which is composed by interlocking a plurality of spacers 27a by a connecting base 27b, is drawn from the connector B. However, it can be arranged such that each spacer 27a is individually separated and inserted into the deformation absorbing space of each of the terminal accommodating chambers 21.

[Effect of the Invention]

As explained heretofore, the present invention is provided for checking a connector, wherein the connector to be checked comprises a connector housing composed of a plurality of terminal accommodating chambers, each being provided with a resilient locking piece for firmly retaining the connector terminal fully inserted therein, and of a deformation absorbing space formed for permitting a deformation of the resilient locking piece, inside which deformation absorbing space a spacer formed with a locking projection at its rear end is inserted for checking whether the terminal is fully inserted, wherein this checking connector device comprises a connector holding member, and a checking device main body which is detachably mounted from the connector holding member, characterized in that the main body is further provided with a plurality of check pins connected with an electric circuit and urged toward the connector holding member by a spring, and a spacer removing piece formed with a hook also urged toward the connector holding member by another spring, and that when the check pin is brought into contact with the fully inserted terminal, the electric circuit is energized, and the hook of the spacer removing piece is fitted with the spacer inserted in the deformation absorbing space, and thereafter when the main body is separated from the connector holding member, the spacer removing piece is completely drawn out from the terminal accommodating chamber.

Thus, it can be judged whether the connector terminal is properly inserted and firmly locked, as well as whether the connector is in an electrically conductive state including the lead wire connected thereto.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A connector checking device for checking a connector, wherein a connector to be checked comprises a connector housing composed of a plurality of terminal accommodating chambers, each being provided with a resilient locking piece formed for firmly retaining the connector terminal fully inserted therein, and of a deformation absorbing space formed for permitting a deformation of said resilient locking piece, inside said deformation absorbing space a spacer formed with a locking projection at its rear end is inserted for checking whether the terminal is fully inserted, wherein said connector checking device comprises:

a connector holding member, and a checking device main body which is detachably mounted from said connector holding member, characterized in that:

said main body is further provided with:

a plurality of check pins connected with an electric circuit and urged toward said connector holding member by a first spring, and a spacer removing piece formed with a hook to be engaged with said locking projection of the spacer, and urged toward said connector holding member by a spring, and that:

when said check pin is brought into contact with the fully inserted terminal, the electric circuit is energized, and the hook of said spacer removing piece is fitted with the spacer inserted in said deformation absorbing space, and thereafter when the said main body is separated from said connector holding member, said spacer removing piece is completely drawn out from the terminal accommodating chamber.

2. A connector checking device as claimed in claim 1, wherein said spacer removing piece is further formed with a slit for receiving and fixing said second spring therein, and a pair of stoppers respectively protruding upper and lower directions from the rear end thereof.

* * * * *